United States Patent [19]

Ohno et al.

[11] Patent Number: 4,513,310
[45] Date of Patent: Apr. 23, 1985

[54] SEMICONDUCTOR DEVICE CAPABLE OF STRUCTURAL SELECTION

[75] Inventors: Junichi Ohno, Yokohama; Satoshi Konishi, Tokyo, both of Japan

[73] Assignee: Tokyo Shibaura Denki Kabushiki Kaisha, Japan

[21] Appl. No.: 493,226

[22] Filed: May 10, 1983

[30] Foreign Application Priority Data

May 12, 1982 [JP] Japan .................................. 57-79415
May 12, 1982 [JP] Japan .................................. 57-79416

[51] Int. Cl.³ .................... H01L 29/40; H01L 29/04; H01L 29/42; B23K 9/24
[52] U.S. Cl. ........................................ 357/68; 357/59; 357/65; 219/121 LJ
[58] Field of Search .................. 357/68, 65, 59; 219/121 LJ

[56] References Cited

U.S. PATENT DOCUMENTS 3,584,183 10/1968 Chiaretta et al. .................. 219/121
3,792,319 2/1974 Tsang .................................. 357/68
3,882,532 5/1975 Quinn .................................. 357/68

OTHER PUBLICATIONS

Minato et al., "Hi-CMOS II 4K Static RAM," ISSCC Digest of Technical Papers, p. 14, Feb. 18, 1981.
Kokkonen et al., "Redundancy Techniques for Fast Static RAMs," IEEE Digest of Technical Papers, p. 80, Feb. 18, 1981.

Primary Examiner—Martin H. Edlow
Assistant Examiner—Terri M. Henn
Attorney, Agent, or Firm—Finnegan, Henderson, Farabow, Garrett & Dunner

[57] ABSTRACT

A first wiring to be connected as needed and second wirings to be disconnected as needed are formed three-dimensionally with an insulation film interposed therebetween. The first wiring comprises at least three first semiconductor regions of a second conductivity type formed at predetermined intervals in the surface of a semiconductor substrate of a first conductivity type, and second semiconductor regions of the first conductivity type formed between each pair of adjacent first semiconductor regions. The second wirings are formed on the first wiring through the insulation film and in a number equal to that of the second semiconductor regions. Each second wiring and the corresponding second semiconductor region are located within a spot of a radiating means radiated vertically onto the semiconductor substrate for switching the wirings.

9 Claims, 19 Drawing Figures

SEMICONDUCTOR DEVICE CAPABLE OF STRUCTURAL SELECTION

BACKGROUND OF THE INVENTION

The present invention relates to a semiconductor device and, more particularly, to a switching element which is capable of structural selection.

A semiconductor device having a redundancy function is conventionally known. In a semiconductor device of this type, structural selection may be made by switching the wiring. For this purpose, one wiring is disconnected while another wiring is electrically connected. Wiring is generally disconnected or cut by supplying a current to polycrystalline silicon, as disclosed in "Redundancy Techniques for Fast Static RAMs", by K. Kokkonen et. al., 1981 ISSCC, Digest of Technical Papers, p. 80. On the other hand, a wiring may be connected by irradiating an intrinsic polycrystalline silicon film between two n+-type regions with laser pulses, as disclosed in "HI-CMOSII 4K Static RAM", by O. Minato et. al., 1981 ISSCC, Digest of Technical Papers, p. 14.

However, neither of these techniques allows simultaneous connection and disconnection of respective wirings.

SUMMARY OF THE INVENTION

It is an object of the present invention to provide a switching element which is used in a semiconductor device capable of structural selection and which allows efficient switching of the wirings.

In order to achieve the above object, in a switching element of the present invention, a first wiring to be connected as needed and second wirings to be disconnected as needed are formed three-dimensionally, with an insulation film interposed therebetween. The first wiring consists of at least three first semiconductor regions of a second conductivity type which are formed having predetermined intervals therebetween in a surface of a semiconductor substrate of a first conductivity type, and of second semiconductor regions of the first conductivity type which are formed between each pair of adjacent first semiconductor regions. The second wirings are formed on the first wiring through the insulation film. The second wirings are formed in correspondence with and having the same number as the second semiconductor regions. Each second wiring and a corresponding second semiconductor region are arranged such that they are located within a spot of a beam which is radiated vertically onto the semiconductor substrate for switching the wirings.

BRIEF DESCRIPTION OF THE DRAWINGS

Other objects and advantages will be apparent from the following description taken in conjunction with the accompanying drawings in which:

FIG. 12 is a plan view of a modification of the switching element shown in FIG. 10.

DETAILED DESCRIPTION OF THE PREFERRED EMBODIMENTS

Figure 1:
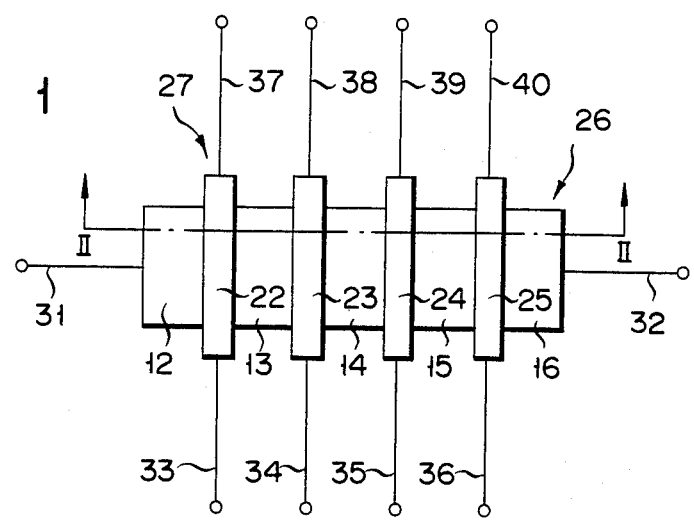
FIG. 1 is a plan view of a switching element according to a first embodiment of the present invention.
Figure 2:
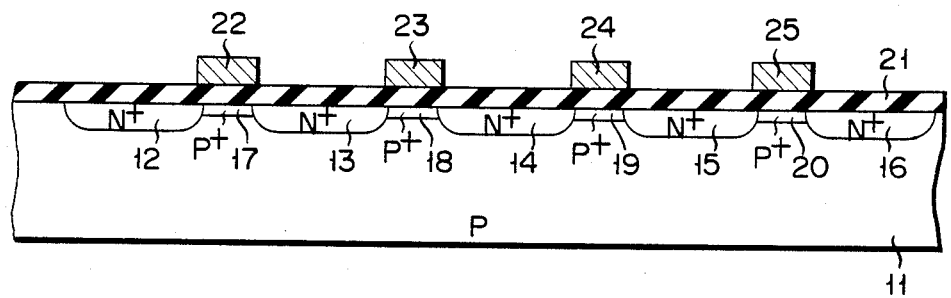
FIG. 2 is a sectional view along the line II—II in FIG. 1.

A switching element according to the first embodiment of the present invention will now be described with reference to FIGS. 1 to 4. Five n+-type semiconductor regions 12, 13, 14, 15 and 16 are formed to have predetermined intervals therebetween on the surface of a p-type silicon substrate 11. P+-type semiconductor regions 17, 18, 19 and 20 are respectively formed between each pair of adjacent n+-type semiconductor regions 12 to 16. Hydrogen ions are injected in the vicinities of the p+-type semiconductor regions 17 to 20 so as to increase the lattice defects of the crystals and to increase the diffusion coefficient of the impurity. The n+- and p+-type semiconductor regions 12 to 16 and 17 to 20, respectively, constitute a first wiring means 26. Polycrystalline silicon layers 22, 23, 24 and 25 are formed through an insulation film 21 of $SiO_2$ on the p+-type semiconductor regions 17 to 20, respectively. The polycrystalline silicon layers 22 to 25 extend across the first wiring means 26, and constitute a second wiring means 27. The n+-type semiconductor region 12 is connected to a predetermined circuit through an Al line 31. The n+-type semiconductor region 16 is similarly connected to another predetermined circuit through an Al line 32. One end of each of the polycrystalline silicon layers 22 to 25 is connected to still another predetermined circuit through Al lines 33, 34, 35 and 36, respectively. The other end of each of the polycrystalline silicon layers 22 to 25 is connected to still another predetermined circuit through Al lines 37, 38, 39 and 40, respectively.

In the initial state the first wiring means 26 of the structure as described above is electrically disconnected, while the second wiring means 27 is electrically connected.

Figure 3:
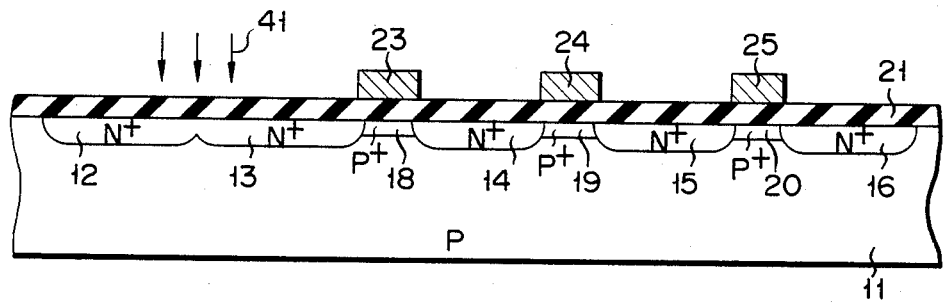
FIG. 3 is a sectional view of the switching element after one polycrystalline silicon layer has been disconnected by irradiation with a laser beam.

When a structural modification must be made, the required portions of the polycrystalline silicon layers 22 to 25 are irradiated with a pulsed second harmonic beam from an Nd:YAG laser having a wavelength of 5,320 Å and an energy of about 8 μJoule for several seconds or microseconds. The polycrystalline silicon layers are fused and are electrically disconnected. FIG. 3 shows a state wherein the polycrystalline silicon layer 22 is electrically disconnected. When a laser beam 41 is radiated onto the polycrystalline silicon layer 22, the polycrystalline silicon layer 22 reaches a temperature above about 1,550° C., which corresponds to a melting temperature thereof, and is partially melted. If the energy density and radiation time of the laser beam 41 are selected such that the polycrystalline silicon layer 22 is kept at a temperature between 1,400° and 1,550° C., the insulation film 21 does not melt (since silicon oxide has a melting point of 1,610° C.). Then, a pair of n+-type semiconductor regions 12 and 13 are heated to a high temperature. The impurity in the n+-type semiconductor regions 12 and 13 diffuses into the p+-type semiconductor region 17, and the n+-type semiconductor regions 12 and 13 are combined with each other. Since the p+-type semiconductor region 17 has many crystal lattice defects, the regions 12 and 13 easily combine with each other.

Figure 4:
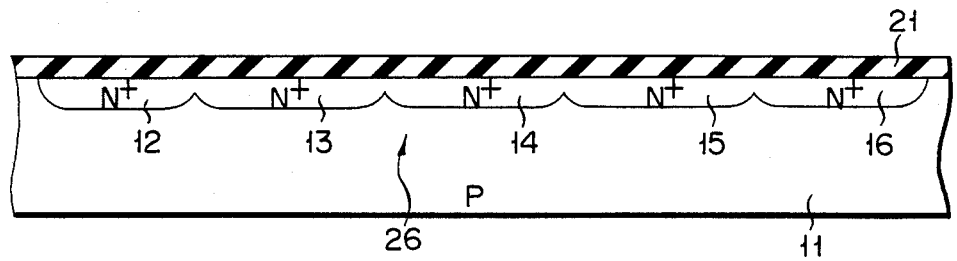
FIG. 4 is a sectional view of the switching element after all the polycrystalline silicon layers have been disconnected by irradiation with a laser beam.

In order to connect the Al lines 31 and 32, all the polycrystalline silicon layers 22 to 25 must be melted, as shown in FIG. 4. When the last one of the polycrystalline silicon layers 22 to 25 is disconnected, the first wiring means 26 is changed from its disconnected state to a connected state. At the same time as the last polycrystalline silicon layer among the polycrystalline silicon layers is melted, the first wiring means 26 is connected, by one radiation operation of the laser beam 41. Therefore, a switching element according to the present invention allows the switching of wiring more efficiently than conventional semiconductor devices.

Figure 5A:
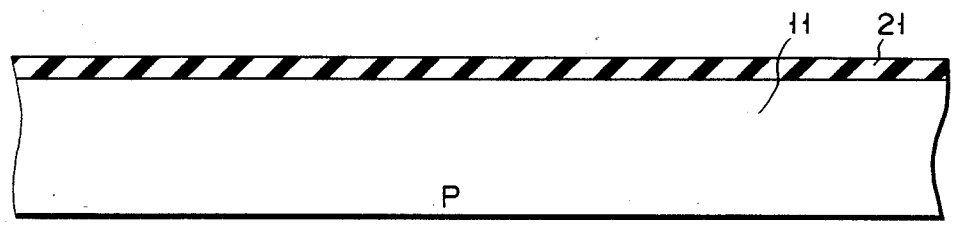
FIGS. 5A to 5C are sectional views of a semiconductor substrate for explaining the steps for manufacturing a switching element according to the present invention.

A method for manufacturing a switching element according to the present invention will now be described with reference to FIGS. 5A to 5C. Referring to FIG. 5A, an insulation film 21 of silicon oxide and of uniform thickness is formed on a p-type silicon semiconductor substrate 11 by thermal oxidation. Using a resist film as a mask, hydrogen ions and a p-type impurity are injected into the structure to form p+-type semiconductor regions 17 to 20. After another resist mask 42 is formed on the p+-type semiconductor regions 17 to 20, an n-type impurity is diffused to form n+-type semiconductor regions 12 to 16. After the resist mask 42 is removed, a polycrystalline silicon layer with a uniform thickness is formed by CVD (chemical vapor deposition). An impurity is injected into the polycrystalline silicon layer for a lower resistance, and polycrystalline silicon layers 22 to 25 are formed by a PEP (photoengraving process).

Figure 5B:
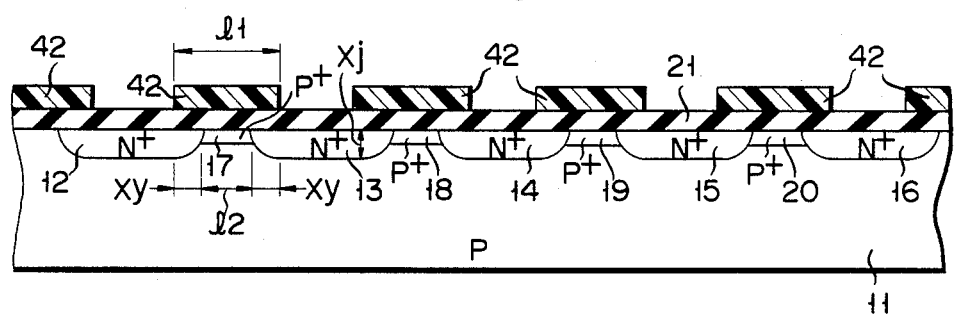
Figure 5C:
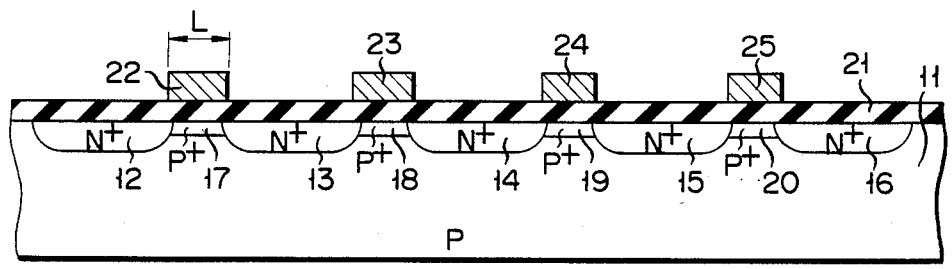

Referring to FIG. 5B, when the length of the resist mask 42 is l1, the length of the p+-type semiconductor regions 17 to 20 is l2, and the diffusion length in the lateral direction of the n+-type semiconductor regions 12 to 16 is Xy, we obtain:

$$l2 = l1 - 2Xy.$$

If a diffusion depth Xj of the n+-type semiconductor regions 12 to 16 is about 1.0 μm, lateral diffusion length Xy is about 0.7 μm. If a length l1 of the resist mask 42 is about 2.0 μm, a length l2 of the p+-type semiconductor regions 17 to 20 is 0.6 μm. Assume that a length L of each of the polycrystalline silicon layers 22 to 25 is 2.0 μm. Then, the respective polycrystalline silicon layers 22 to 25 may be disconnected while pairs of adjacent n+-type semiconductor regions 12 and 13, 13 and 14, 14 and 15, and 15 and 16 are simultaneously connected by radiation of a beam for several seconds or several microseconds. The beam may be a pulsed second harmonic beam from an Nd:YAG laser having a wavelength of 5,320 Å and an energy of about 8 μJoule for several seconds or several microseconds, with a spot greater than the length of the polycrystalline silicon layers 22 to 25, that is, 2 μm.

Figure 6:
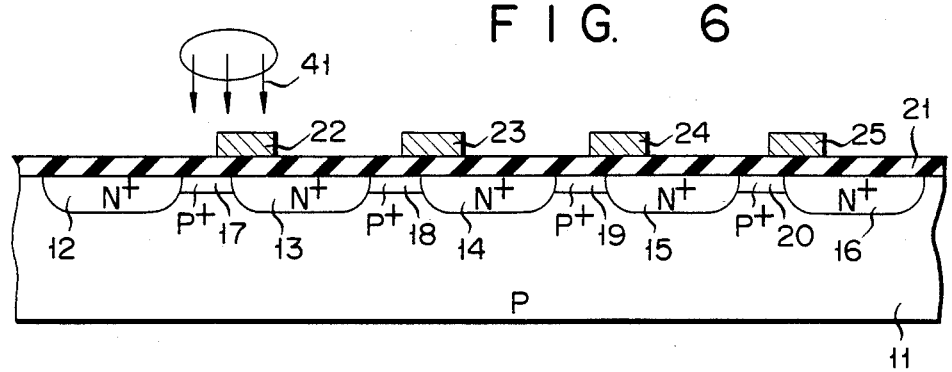
FIGS. 6 and 7 are sectional views of switching elements according to second and third embodiments, respectively, of the present invention.

A switching element according to a second embodiment of the present invention will now be described with reference to FIG. 6. In the first embodiment shown in FIG. 2, the polycrystalline silicon layers 22 to 25 are formed immediately above the corresponding p+-type semiconductor regions 17 to 20 through the insulation film 21. However, in the second embodiment, a polycrystalline silicon layer 22 is formed to partially overlap both an n+-type semiconductor region 13 and a p+-type semiconductor region 17 through an insulation film 21. Other polycrystalline silicon layers 23, 24 and 25 are similarly formed to partially overlap an n+-type semiconductor region 14 and an p+-type semiconductor region 18, an n+-type semiconductor region 15 and a p+-type semiconductor region 19, and an n+-type semiconductor region 16 and a p+-type semiconductor region 20, respectively, through the insulation film 21. In order to disconnect, for example, the polycrystalline silicon layer 22 in the semiconductor device of the structure as described above, the spot diameter of a laser beam may be determined so as to encompass at least the polycrystalline silicon layer 22 and the p+-type semiconductor region 17, as shown in FIG. 6. In the semiconductor device of this structure, it is also possible to disconnect the last one of the polycrystalline silicon layers 22 to 25 while simultaneously connecting a first wiring means 26 which is in a disconnected state. In particular, in this embodiment, part of the laser beam 41 is not radiated onto the polycrystalline silicon layer 22 but is radiated onto the p+-type semiconductor region 17 and the n+-type semiconductor region 12. Therefore, the n+-type semiconductor regions 12 and 13 may be efficiently connected. Other details of the second embodiment remain the same as those of the first embodiment shown in FIG. 2. The same reference numerals in FIG. 6 denote the same parts in FIG. 2, and a detailed description thereof will be omitted.

Figure 7:
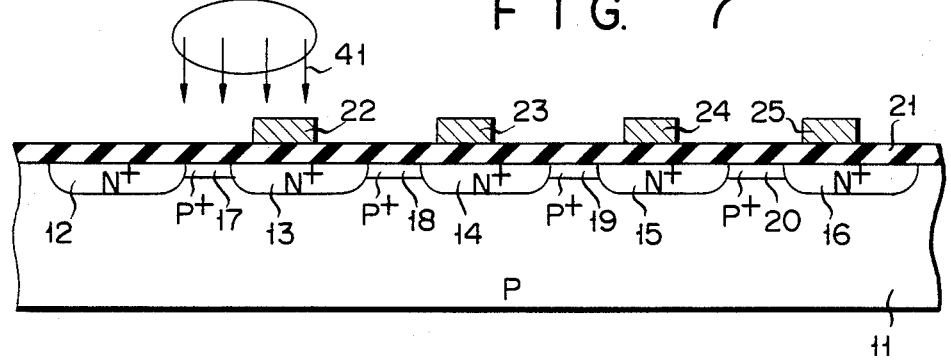

A switching element according to a third embodiment of the present invention will now be described with reference to FIG. 7. In this embodiment, a polycrystalline silicon layer 22 is formed on an n+-type semiconductor region 13, a polycrystalline silicon layer 23 is formed on an n+-type semiconductor region 14, a polycrystalline silicon layer 24 is formed on an n+-type semiconductor region 15, and a polycrystalline silicon layer 25 is formed on an n+-type semiconductor region 16, through an insulation film 21, respectively. In order to disconnect, for example, the polycrystalline silicon layer 22 in the semiconductor element of this embodiment, the spot diameter of a laser beam 41 is selected to encompass the polycrystalline silicon layer 22 and a p+-type semiconductor region 17, as shown in FIG. 7. Similar effects as those obtained in the first and second embodiments described above may also be obtained in this third embodiment.

According to the present invention, as may be seen from the description of the first to third embodiments, the polycrystalline silicon layers 22 to 25 may be arranged within a considerably wide range so that mask alignment precision need not be particularly high.

Figure 8:
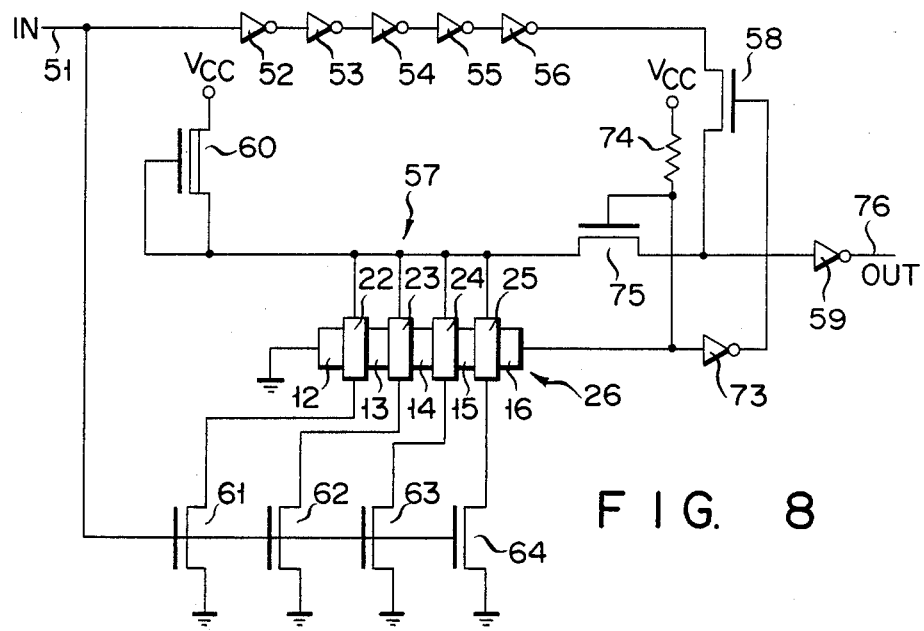
FIG. 8 shows a circuit diagram of a delay circuit using the switching element of the present invention.

A signal delay circuit using the switching element according to the present invention will now be described with reference to FIG. 8. The signal delay circuit allows selection of a delay time of an input signal IN. The input signal IN supplied onto a signal line 51 is delayed by five series-connected inverters 52, 53, 54, 55 and 56 or by an E/D type inverter 57 in which the number of drive MOS transistors may be variable. The input signal IN is supplied to the first stage of the series-connected inverters 52 to 56, and an output from the last stage is supplied to an output inverter 59 through an enhancement-type (E-type) MOS transistor 58. The inverter 57 has a depletion-type (D-type) MOS transistor 60 as a load MOS transistor, and four E-type MOS transistors 61 to 64 as drive MOS transistors. The MOS transistors 61 to 64 are connected to the MOS transistor 60 through polycrystalline silicon layers 22 to 25, respectively. The n+-type semiconductor region 12 is grounded, and the n+-type semiconductor region 16 is connected to the input end of an inverter 73. The input end of the inverter 73 is further connected to a pull-up resistor 74 and to a gate of a MOS transistor 75. The output end of the inverter 73 is connected to a gate of the MOS transistor 58. An output from the inverter 57 is supplied to the inverter 59 through the MOS transistor 75. Therefore, an output signal OUT corresponding to the input signal IN is obtained from an output line 76 of the inverter 59.

Figure 9:
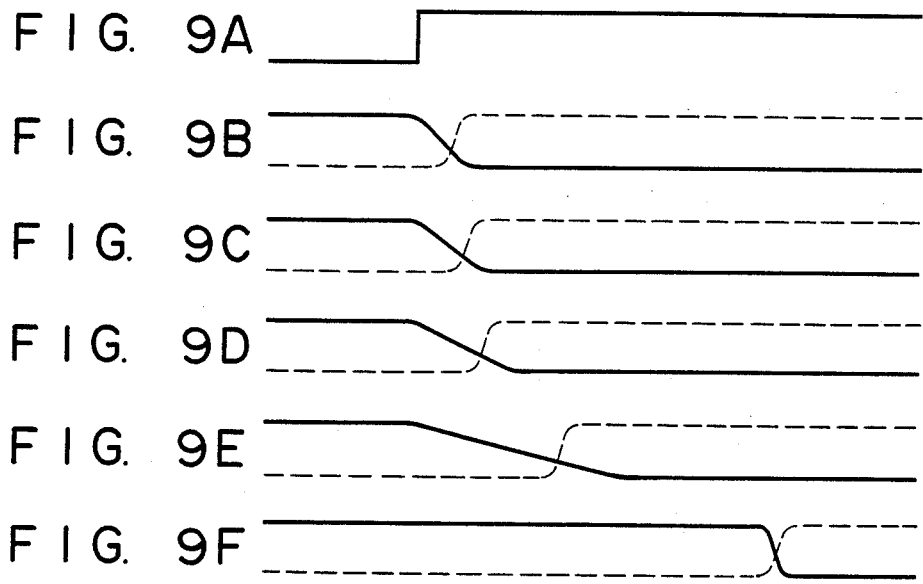
FIGS. 9A to 9F show signal waveforms for explaining selection of delay time in the delay circuit shown in FIG. 8.

In the initial state of the signal delay circuit of the configuration as described above, all the polycrystalline silicon layers 22 to 25 are connected, and n+-type semiconductor regions 12 to 16 are isolated from each other. Therefore, a signal of logic level "1" is supplied to a gate of the MOS transistor 75, while a signal of logic level "0" is supplied to a gate of the MOS transistor 58. Then, an output from the E/D inverter 57 is supplied to the output inverter 59. When an input signal IN as shown in FIG. 9A is supplied onto the signal line 51, the output signal from the E/D type inverter 57 falls with a predetermined slope as indicated by a solid line in FIG. 9B. An output signal OUT appearing on the signal line 76 is a delayed signal which is slightly delayed from the input signal IN, as indicated by a broken line in FIG. 9B.

In order to change the delay time, the surface of the polycrystalline silicon layer 22 is irradiated with a laser beam and the polycrystalline silicon layer 22 is disconnected. Then, the current flowing in the load MOS transistor 60 decreases. Therefore, the waveform of the output signal from the inverter 57 and the waveform of the output signal OUT from the signal line 76 become as indicated by a solid line and a broken line, respectively, shown in FIG. 9C. When the polycrystalline silicon layers 23 and 24 are sequentially disconnected, the waveform of the output signal from the inverter 57 and the waveform of the output signal OUT from the signal line 76 become as shown in FIGS. 9D and 9E, respectively.

If a function circuit block connected to the signal line 51 requires an extremely long delay time, the laser beam is radiated onto the remaining polycrystalline silicon layer 25. Then, the polycrystalline silicon layer 25 is disconnected while at the same time the n+-type semiconductor regions 15 and 16 combine together. Note that the n+-type semiconductor regions 12, 13, 14 and 15 are already electrically connected when the polycrystalline silicon layers 22, 23 and 24 are disconnected. Therefore, when the polycrystalline silicon layer 25 is disconnected, the first wiring means 26 is electrically connected. When R1 is the resistance of the resistor 74 and R2 is the resistance of the first wiring means 26, an input level V to the inverter 73 is given by:

$$V = \{R2/(R1+R2)\} \cdot Vcc$$

The circuit is designed such that the MOS transistor 75 is OFF and the MOS transistor 58 is ON when the input level V to the inverter 73 is given by the above equation. Since the input signal IN is significantly delayed by the five series-connected inverters 52 to 56, the output waveform of the last inverter 56 becomes as indicated by a solid line in FIG. 9F. The waveform of the output signal OUT from the signal line 76 becomes as shown by a broken line in FIG. 9F.

In the signal delay circuit as described above, all of the polycycrstalline silicon layers 22 to 25 are disconnected while at the same time the first wiring means 26 is connected from a disconnected state. Thus, wiring may be switched efficiently.

Figure 10:
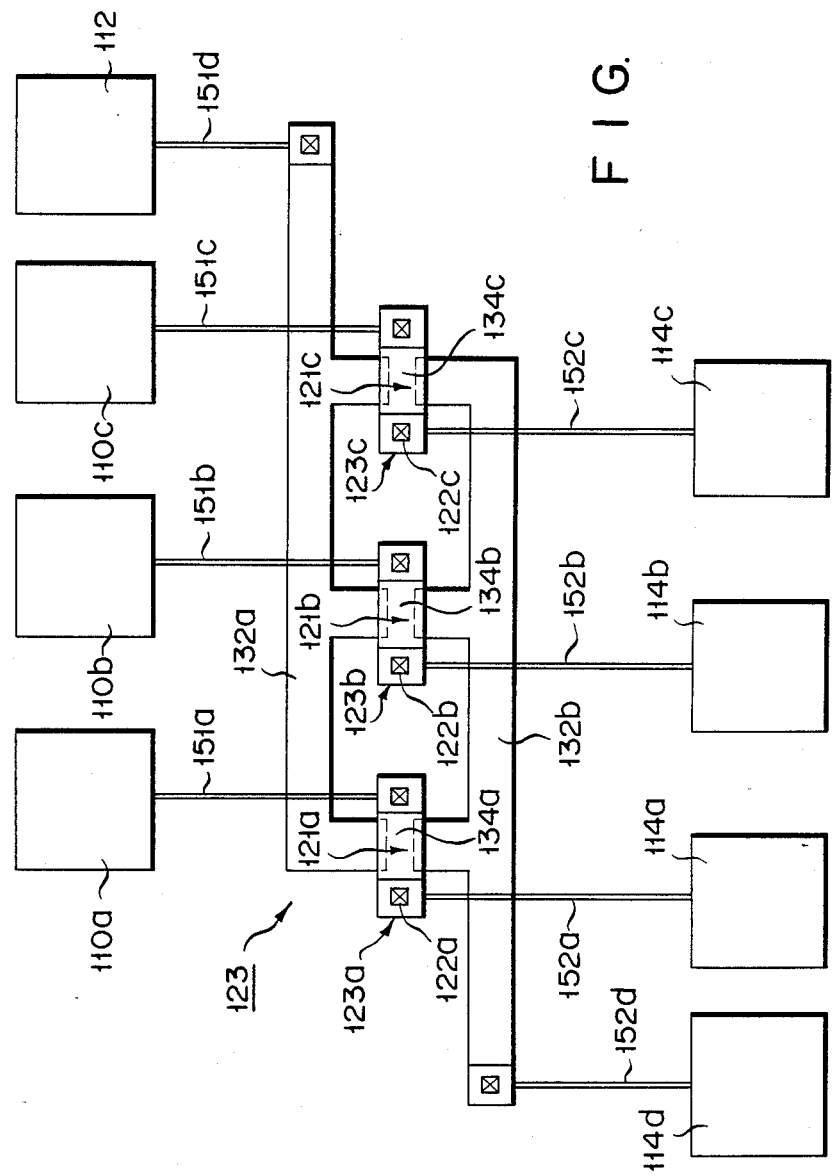
FIG. 10 is a plan view of a switching element according to a fourth embodiment of the present invention.

FIG. 10 shows a switching element according to a fourth embodiment of the present invention. The switching element 123 connects the redundancy function circuit block 112 to function circuit blocks 110a, 110b and 110c which are normally used in the device. The switching element 123 has a first switching portion 123a connected to the function circuit block 110a, a second switching portion 123b connected to the function circuit block 110b, and a third switching portion 123c connected to the function circuit block 110c. The first switching portion 123a comprises a first wiring means 121a and a second wiring means 122a comprising polycrystalline silicon. The second switching portion 123b comprises a first wiring means 121b and a second wiring means 122b comprising polycrystalline silicon. The third switching portion 123c comprises a first wiring means 121c and a second wiring means 122c comprising polycrystalline silicon. One end of each of the first wiring means 121a, 121b and 121c is connected to the p+-type semiconductor region 132a, while the other end of each of the first wiring means 121a, 121b and 121c is connected to the p+-type semiconductor region 132b. Further, the first wiring means 121a, 121b and 121c have n+-type semiconductor regions 134a, 134b and 134c which are interposed between the p+-type semiconductor regions 132a and 132b, respectively. One end of each of the second wiring means 122a, 122b and 122c is connected to each of the function circuit blocks 110a, 110b and 110c, which are normally used in the device, through each of the Al lines 151a, 151b and 151c. The other end of each of the second wiring means 122a, 122b and 122c is connected to each of the function circuit blocks 114a, 114b and 114c through each of the Al lines 152a, 152b and 152c.

The p+-type semiconductor region 132a is connected to the redundancy function circuit block 112 through the Al line 151d, while the p+-type semiconductor region 132b is connected to the function circuit block 114d through the Al line 152d.

In the switching element 123 with the above arrangement, if one of the function circuit blocks is broken, the broken circuit block is switched to the corresponding redundancy function circuit block. For example, if the function circuit block 110a is broken, the second harmonic Nd:YAG laser beam having a wavelength of about 5,320 Å and an energy density of about 8 μJoules is radiated onto the switching portion 123a to connect the redundancy function circuit block 112 in place of the function circuit block 110a.

Figure 11:
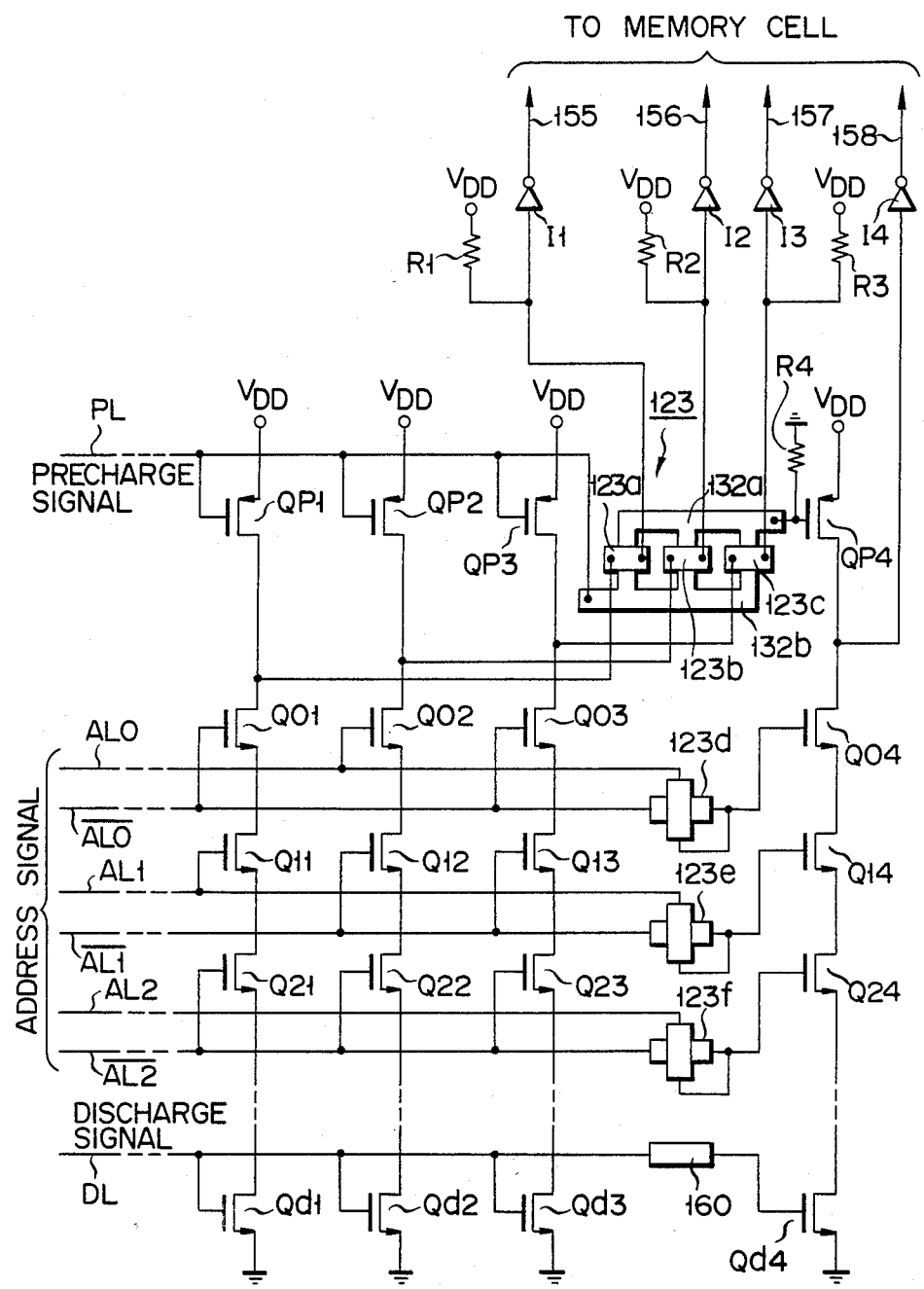
FIG. 11 is a circuit diagram of a row decoder using the switching element as shown in FIG. 10.

A row decoder using the switching element according to the present invention will be described with reference to FIG. 11. A precharge control line PL which receives a precharge signal PS is connected to the gate electrodes of p-channel MOS transistors Qp1, Qp2 and Qp3. Address signals A0, A1, A2, ... are supplied to address lines AL0, AL1, AL2, ..., respectively. Inverted address signals $\overline{A0}, \overline{A1}, \overline{A2}, \ldots$ are supplied to inverted address lines $\overline{AL0}, \overline{AL1}, \overline{AL2}, \ldots$, respectively. A discharge control line DL which receives a discharge signal DS is connected to the gate electrodes of n-channel MOS transistors Qd1, Qd2 and Qd3. A source of the MOS transistor Qp1 is connected to a power source VDD and a drain thereof is grounded through n-channel MOS transistors Q01, Q11, Q21, ..., and Qd1. A source of the MOS transistor Qp2 is connected to the power source VDD and a drain thereof is grounded through n-channel MOS transistors Q02, Q12, Q22, ..., and Qd2. The address line AL0 is connected to a gate of the MOS transistor Q02. The inverted address line $\overline{AL0}$ is connected to the gates of the MOS transistors Q01 and Q03. The address line AL1 is connected to a gate of the MOS transistor Q11. The inverted address line $\overline{AL1}$ is connected to the gates of the MOS transistors Q12 and Q13. The inverted address line $\overline{AL2}$ is connected to the gates of the MOS transistors Q21, Q22 and Q23. The drain of the MOS transistor Q01 is connected to the memory cell through the first switching portion 123a, an inverter I1 and a selection line 155. The drain of the MOS transistor Q02 is connected to the memory cell through the second switching portion 123b, an inverter I2 and a selection line 156. The drain of the MOS transistor Q03 is connected to the memory cell through the third switching portion 123c, an inverter I3 and a selection line 157. The switching portions 123a, 123b and 123c constitute the same switching element 123 as that shown in FIG. 10.

In the row decoder described above, a redundancy decoder is connected to the redundancy memory cell through an inverter I4 and a selection line 158. The redundancy decoder comprises the p-channel MOS transistor Qp4 and n-channel MOS transistors Q04, Q14, Q24, ..., and Qd4 which are series connected between the power source VDD and the ground. A gate of the MOS transistor Qp4 is connected to the p+-type semiconductor region 132a of the switching element 123. The p+-type semiconductor region 132b is connected to the precharge control line PL. A gate of the MOS transistor Q04 is connected to the address line AL0 and the inverted address line $\overline{AL0}$ through a switching element 123d. A gate of the MOS transistor Q14 is connected to the address line AL1 and the inverted address line $\overline{AL1}$ through a switching element 123e. A gate of the MOS transistor Q24 is connected to the address line AL2 and the inverted address line $\overline{AL2}$ through a switching element 123f. A gate of the MOS transistor Qd4 is connected to the discharge line DL through an element 160 which is normally disconnected electrically. The element 160 has the same arrangement as the conventional switching element.

Input ends of the inverters I1 to I3 are connected to the power source VDD respectively through resistors R1 to R3. A gate of the MOS transistor Qp4 is grounded throught a resistor R4.

In the decoder of the type having the arrangement described above, if the memory cell connected to the selection line 155 is defective, a laser beam is radiated on the switching portion 123a. As a result, the gate of the redundancy MOS transistor Qp4 is electrically connected to the precharge line PL. The selection line 155 is connected to the power source VDD through the inverter I1 and the resistor R1, so that the selection line 155 is constantly kept at "L" level. Further, the laser beam is radiated on the switching element 123d, and the gate of the MOS transistor Q04 is electrically connected to the inverted address line $\overline{AL0}$. The gate of the MOS transistor Q14 is electrically connected to the address line AL1 in the same manner as the MOS transistor Q11, so that the switching element 123e need not be switched. Further, the laser beam is radiated onto the switching element 123f, so that the gate of the MOS transistor Q24 is electrically connected to the inverted address line $\overline{AL2}$.

The laser beam is radiated onto the element 160 which is disconnected, and the gate of the MOS transistor Qd4 is electrically connected to the discharge control line DL. Therefore, the redundancy memory cell connected to the selection line 158 is selected. The frequency of laser radiation is decreased as compared with the frequency in the conventional method.

Further, in the decoder of this type, the redundancy MOS transistors Q04, Q14, Q24, ... are first electrically connected to the address lines AL0, AL1, AL2, ..., respectively. The laser beam is radiated only on the switching element to be switched to the inverted address line, and the frequency of laser radiation is decreased.

The element 160 is arranged not to set the selection line 158 to "H" level if the redundancy memory cell need not be used.

FIG. 12 shows a modification of the switching element shown in FIG. 10. Three switching elements are separately formed. The switching elements in FIG. 12 have the same arrangement as the switching element in FIG. 10 except that p+-type semiconductor regions 132a1, 132a2 and 132a3 which constitute the first wiring means are mutually connected by a line 161 of aluminum and that p+-type semiconductor regions 132b1, 132b2 and 132b3 are connected by a line 162 of aluminum. Therefore, the same reference numerals used in FIG. 10 denote the same parts in FIG. 12, and a detailed description thereof will be omitted. According to the modification described above, if one of the circuits connected to the Al lines 151a, 151b and 151c is broken, the laser beam is only radiated onto the switching portion connected to the broken circuit. Thus, the broken circuit is readily switched to the redundancy function circuit.

The present invention is not limited to the embodiments described above, and various modifications may be made. For example, in the above embodiments, heating is performed by laser beam radiation. However, radiation of another energy beam such as an electron beam may be used. Alternatively, a heating element may be formed inside a semiconductor device and heating may be performed internally by the heating element. Conductor layers of aluminum may be used in place of the polycrystalline silicon layers 22 to 25. If an Al conductor layer is used, it may be more easily melted than the polycrystalline silicon layers 22 to 25 since the melting temperature of aluminum is 660° C.

In the above embodiments, hydrogen ions are injected in the p+-type semiconductor regions 17 to 20 in order to increase the lattice defects of the crystals. However, ions of at least one element selected from helium, neon, argon, krypton, xenon and radon may alternatively be injected.

What we claim is:

1. A semiconductor device capable of structural selection in response to the output of a radiating means, said device comprising:

a semiconductor substrate of a first conductivity type;

first wiring means having at least three first semiconductor regions of a second conductivity type which are formed at predetermined intervals in a surface of said semiconductor substrate, and at least two second semiconductor regions of the first conductivity type which are formed one each between pairs of adjacent ones of said first semiconductor regions, said first wiring means being electrically disconnected in an initial state;

an insulation film located over at least a portion of said first wiring means; and a plurality of second wiring means which are formed on said insulation film over said first wiring means in correspondence with said second semiconductor regions, respectively, with each of said second wiring means extending across said first wiring means and being electrically connected in the initial state, and with each of said second wiring means and a corresponding one of said second semiconductor regions being formed at positions such that said each of said second wiring means and said corresponding one of said second semiconductor regions may be subject to the output of said radiating means so as to electrically disconnect said each of said second wiring means while at the same time electrically connecting together said first semiconductor regions arranged one at each side of said corresponding one of said second semiconductor regions.

2. A semiconductor device according to claim 1, wherein said second wiring means are formed on said insulation film over said second semiconductor regions.

3. A semiconductor device according to claim 1, wherein said second wiring means are formed on said insulation film over said first and second semiconductor regions so as to overlap with said first and second semiconductor regions.

4. A semiconductor device according to claim 1, wherein said second wiring means are formed on said insulation film over said first semiconductor regions.

5. A semiconductor device according to claim 1, wherein said second wiring means is formed of polycrystalline silicon.

6. A semiconductor device according to claim 1, wherein said second wiring means is formed of aluminum.

7. A semiconductor device according to claim 1, wherein said radiating means is a laser.

8. A semiconductor device according to claim 1, wherein said radiating means is an electron beam source.

9. A semiconductor device accoreding to claim 1, wherein said second semiconductor regions include ions of at least one element selected from the group consisting of hydrogen, helium, neon, argon, krypton, xenon, and radon.

* * * * *